United States Patent
Harrell et al.

(10) Patent No.: US 12,216,164 B2
(45) Date of Patent: Feb. 4, 2025

(54) OUTPUT VOLTAGE GLITCH REDUCTION IN TEST SYSTEMS

(71) Applicant: Analog Devices, Inc., Wilmington, MA (US)

(72) Inventors: Michael E. Harrell, Colorado Springs, CO (US); Anthony Eric Turvey, Poughkeepsie, NY (US); Stefano I D'Aquino, Westford, MA (US); Jennifer W. Pierdomenico, Temple, PA (US)

(73) Assignee: Analog Devices, Inc., Wilmington, MA (US)

( * ) Notice: Subject to any disclaimer, the term of this patent is extended or adjusted under 35 U.S.C. 154(b) by 169 days.

(21) Appl. No.: 17/904,935

(22) PCT Filed: Feb. 24, 2021

(86) PCT No.: PCT/US2021/019372
§ 371 (c)(1),
(2) Date: Aug. 24, 2022

(87) PCT Pub. No.: WO2021/173638
PCT Pub. Date: Sep. 2, 2021

(65) Prior Publication Data
US 2023/0176110 A1 Jun. 8, 2023

Related U.S. Application Data

(60) Provisional application No. 63/114,775, filed on Nov. 17, 2020, provisional application No. 62/980,772, filed on Feb. 24, 2020.

(51) Int. Cl.
*G01R 31/28* (2006.01)
*G01R 31/319* (2006.01)
(Continued)

(52) U.S. Cl.
CPC ... *G01R 31/31924* (2013.01); *G01R 31/2834* (2013.01); *H03F 1/523* (2013.01);
(Continued)

(58) Field of Classification Search
CPC .......... G01R 31/31924; G01R 31/2834; H03F 1/523; H03F 3/04; H03F 3/16
See application file for complete search history.

(56) References Cited

U.S. PATENT DOCUMENTS

| 4,704,575 A | 11/1987 | Amoux et al. |
| 5,010,297 A | 4/1991 | Babcock |

(Continued)

FOREIGN PATENT DOCUMENTS

| CN | 105680431 B | 7/2018 |
| CN | 116615662 | 8/2023 |

(Continued)

OTHER PUBLICATIONS

"25V Span, 800mA Device Power Supply (DPS)", Maxim Integrated Products, (2011), 24 pgs.
(Continued)

*Primary Examiner* — Dominic E Hawkins
(74) *Attorney, Agent, or Firm* — Schwegman Lundberg & Woessner, P.A.

(57) ABSTRACT

A clamp circuit comprises an output transistor and a replica transistor coupled as a current minor pair, wherein the replica transistor is scaled in size to the output transistor by a size ratio; a first current source configured to set a current in the replica transistor, wherein the output current is set at a clamped output current value that is a sum of current of the first current source and a scaled value of the current of the first current source determined according to the size ratio; and a register circuit, wherein a register value stored in the register circuit sets the clamped output current value.

16 Claims, 4 Drawing Sheets

(51) Int. Cl.
*H03F 1/52* (2006.01)
*H03F 3/04* (2006.01)
*H03F 3/16* (2006.01)

(52) U.S. Cl.
CPC ............. *H03F 3/04* (2013.01); *H03F 3/16* (2013.01); *H03F 2200/441* (2013.01)

(56) References Cited

U.S. PATENT DOCUMENTS

| | | | |
|---|---|---|---|
| 5,463,315 | A | 10/1995 | Grace et al. |
| 5,745,003 | A | 4/1998 | Wakimoto et al. |
| 5,917,331 | A | 6/1999 | Persons |
| 6,563,352 | B1* | 5/2003 | Gohel ............ G01R 31/31924 327/108 |
| 6,677,775 | B2 | 1/2004 | Babcock |
| 6,756,807 | B2 | 6/2004 | Johnson et al. |
| 6,900,621 | B1 | 5/2005 | Gunther |
| 7,154,260 | B2 | 12/2006 | Chow |
| 7,174,143 | B1 | 2/2007 | Turvey |
| 7,521,937 | B2 | 4/2009 | Nagata |
| 7,538,539 | B1 | 5/2009 | Balke |
| 7,903,008 | B2 | 3/2011 | Regier |
| 7,978,109 | B1 | 7/2011 | Kuramochi |
| 8,207,725 | B2 | 6/2012 | Sullivan et al. |
| 8,710,541 | B2 | 4/2014 | Aherne et al. |
| 8,829,975 | B2 | 9/2014 | Aherne |
| 8,975,913 | B2 | 3/2015 | Smith |
| 9,182,767 | B2 | 11/2015 | Srivastava et al. |
| 9,397,635 | B2 | 7/2016 | Costa |
| 9,435,863 | B2 | 9/2016 | Chen et al. |
| 9,523,722 | B2 | 12/2016 | Tasher et al. |
| 9,671,427 | B2 | 6/2017 | Johnson et al. |
| 10,192,630 | B1 | 1/2019 | Hoskins |
| 10,345,418 | B2 | 7/2019 | Wadell et al. |
| 10,778,212 | B1 | 9/2020 | D'Aquino et al. |
| 11,022,629 | B2 | 6/2021 | D'Aquino et al. |
| 11,054,444 | B2 | 7/2021 | Borthwick |
| 11,105,843 | B2 | 8/2021 | Singh et al. |
| 11,940,496 | B2 | 3/2024 | Harrell et al. |
| 2002/0021148 | A1 | 2/2002 | Goren et al. |
| 2002/0121885 | A1 | 9/2002 | Taylor |
| 2006/0176519 | A1* | 8/2006 | Ouchi ............ H04N 25/627 358/443 |
| 2006/0273811 | A1 | 12/2006 | Haigh et al. |
| 2007/0069755 | A1 | 3/2007 | Sartschev |
| 2009/0189573 | A1* | 7/2009 | Turchi ............ H02H 7/1216 323/234 |
| 2011/0115544 | A1 | 5/2011 | Birk |
| 2012/0105066 | A1 | 5/2012 | Marvin et al. |
| 2014/0070831 | A1 | 3/2014 | Kushnick et al. |
| 2015/0038092 | A1 | 2/2015 | Andrys et al. |
| 2016/0241019 | A1* | 8/2016 | Li ............ H02H 9/025 |
| 2017/0269149 | A1 | 9/2017 | Mcquilkin |
| 2020/0011928 | A1 | 1/2020 | Mucke et al. |
| 2020/0041546 | A1 | 2/2020 | Liberty |
| 2020/0127624 | A1 | 4/2020 | Basilico et al. |
| 2020/0271717 | A1 | 8/2020 | Nakamura et al. |
| 2021/0021257 | A1 | 1/2021 | Shrivastava et al. |
| 2021/0255268 | A1 | 8/2021 | Kao et al. |
| 2023/0114208 | A1 | 4/2023 | Harrell et al. |
| 2024/0036114 | A1 | 2/2024 | Aherne et al. |

FOREIGN PATENT DOCUMENTS

| | | |
|---|---|---|
| DE | 112021006392 | 9/2023 |
| JP | H11133068 A | 5/1999 |
| JP | 2008209997 A | 9/2008 |
| JP | 2008301287 A | 12/2008 |
| JP | 2011043434 A | 3/2011 |
| TW | 200842384 | 11/2008 |
| TW | I354804 | 12/2011 |
| TW | I814168 | 9/2023 |
| WO | WO-2008059766 A1 | 5/2008 |
| WO | WO-2021173635 A1 | 9/2021 |
| WO | WO-2021173638 A1 | 9/2021 |
| WO | WO-2022122561 A1 | 6/2022 |

OTHER PUBLICATIONS

"International Application Serial No. PCT/EP2021/084047, International Search Report mailed Apr. 29, 2022", 4 pgs.

"International Application Serial No. PCT/EP2021/084047, Written Opinion mailed Apr. 29, 2022", 10 pgs.

"International Application Serial No. PCT/US2021/019368, International Search Report mailed Jun. 14, 2021", 4 pgs.

"International Application Serial No. PCT/US2021/019368, Written Opinion mailed Jun. 14, 2021", 6 pgs.

"International Application Serial No. PCT/US2021/019372, International Search Report mailed Jun. 8, 2021", 3 pgs.

"International Application Serial No. PCT/US2021/019372, Written Opinion mailed Jun. 8, 2021", 6 pgs.

Ding, Jialin, "DC Parametric Test and IDDQ Test Using Advantest T2000 ATE", MS Thesis, Auburn University, (Aug. 1, 2015), 100 pgs.

Liberti, Anselmo Gianluca, et al., "Suppressing voltage glitches in SiC MOSFETs", PCIM Europe 2019, Nuremberg, Germany, (May 7-9, 2019), 7 pgs.

Mauromicale, Giuseppe, "Improvement of SiC power module layout to mitigate the gate-source overvoltage during switching operation", 2019 AEIT International Conference of Electrical and Electronic Technologies for Automotive (Aeit Automotive), IEEE, (2019), 16 pgs.

"International Application Serial No. PCT/US2021/019368, International Preliminary Report on Patentability mailed Sep. 9, 2022", 8 pgs.

"International Application Serial No. PCT/US2021/019372, International Preliminary Report on Patentability mailed Sep. 9, 2022", 7 pgs.

"Taiwanese Application Serial No. 110145810, Office Action mailed Nov. 4, 2022", w/ English Translation, 22 pgs.

"Taiwanese Application Serial No. 110145810, Response filed Feb. 1, 2023 to Office Action mailed Nov. 4, 2022", 54 pgs.

"U.S. Appl. No. 17/904,931, Restriction Requirement mailed May 23, 2023", 4 pgs.

"International Application Serial No. PCT/EP2021/084047, International Preliminary Report on Patentability mailed Jun. 22, 2023", 12 pgs.

"U.S. Appl. No. 17/904,931, Response filed Jul. 21, 2023 to Restriction Requirement mailed May 23, 2023", 7 pgs.

"U.S. Appl. No. 17/904,931, Non Final Office Action mailed Aug. 2, 2023", 11 pgs.

"U.S. Appl. No. 17/904,931, Response filed Nov. 1, 2023 to Non Final Office Action mailed Aug. 2, 2023", 10 pgs.

"U.S. Appl. No. 17/904,931, Notice of Allowance mailed Nov. 20, 2023", 9 pgs.

* cited by examiner

OUTPUT VOLTAGE GLITCH REDUCTION IN TEST SYSTEMS

CLAIM OF PRIORITY

This application is a U.S. National Stage of PCT Application Serial No. PCT/US2021/019372, filed Feb. 24, 2021, as WO 2021/173638 A1 on Sep. 2, 2021, which claims priority to U.S. Provisional Application Ser. No. 62/980,772, filed Feb. 24, 2020, and U.S. Provisional Application Ser. No. 63/114,775, filed Nov. 17, 2020, which are hereby incorporated by reference herein in their entirety.

FIELD OF THE DISCLOSURE

This document relates to automated testing systems.

BACKGROUND

Automated test equipment can be used to assess the quality of manufactured parts. Automated test systems can include instrumentation circuitry to apply test signals to a device under test (DUT) to check for errors or flaws in the DUT. The test signals applied by the instrumentation circuitry should not cause false indications of failures or mask actual failures of the DUT.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Automated test systems can include instrumentation circuitry to apply test signals to a device under test (DUT), but the test signals generated by the instrumentation circuitry should not cause false indications of failures or mask actual failures of the DUT. Test circuitry can apply current to the DUT. Switching from one current range to another current range during the testing can cause undesired glitches at a test monitoring point.

Figure 1:
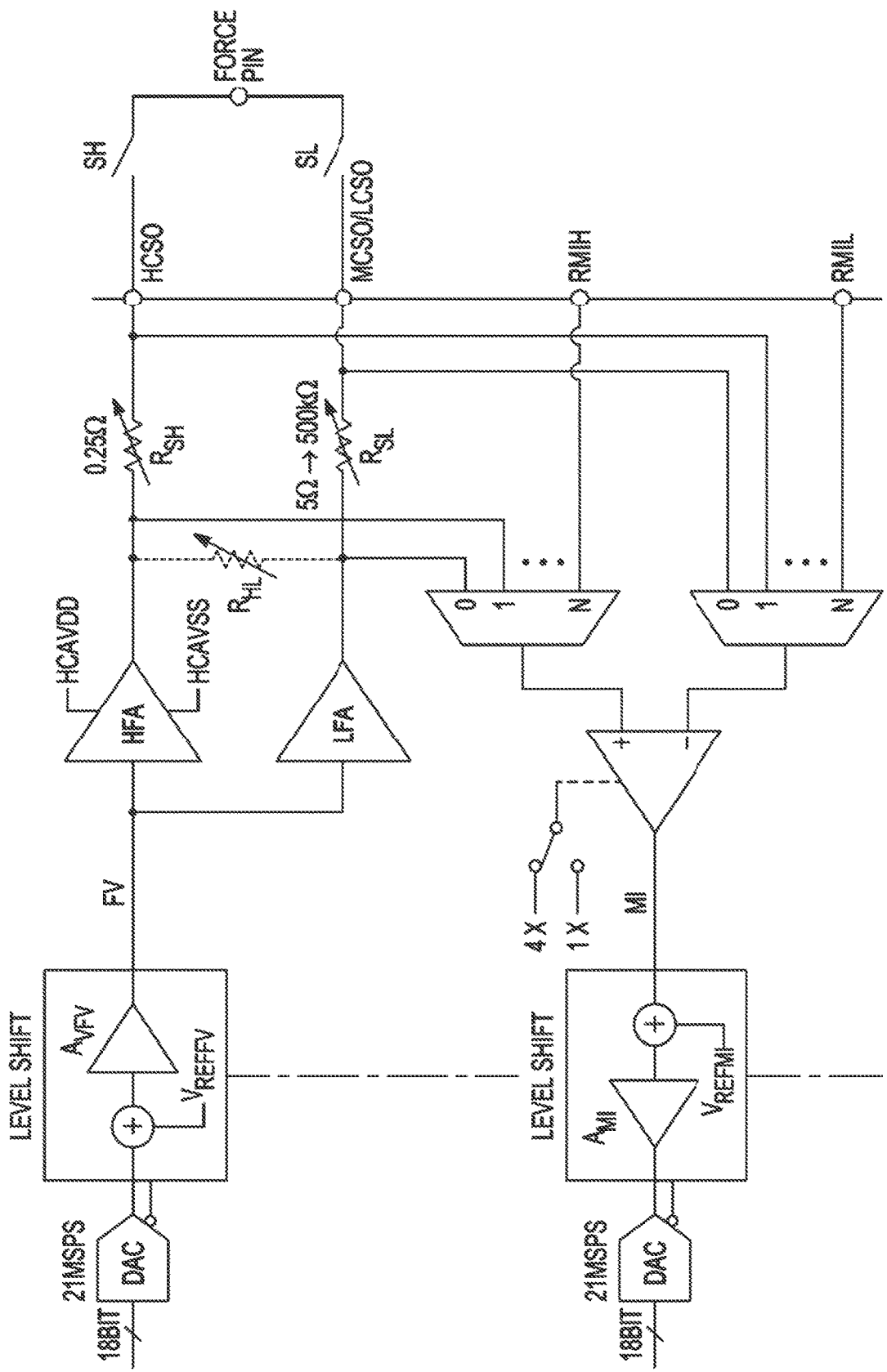
FIG. 1 is a schematic of an example of a testing circuit of an automated test system.

FIG. 1 is a circuit schematic of an example of test circuitry for an automated test system. The circuit includes two output stages. Each output stage includes a force amplifier. One stage includes a high current force amplifier (HFA), and the second stage includes a low current force amplifier (LFA). The HFA and LFA are coupled to high side switch circuit (SH) and low side switch circuit (SL) respectively. Switches SH and SL are coupled to a FORCE pin.

The voltages across each output stage can be significantly different and load-current dependent. Suddenly transitioning the output from one output stage to another output stage can cause a glitch equal to the difference of the voltage across each output stage. This voltage glitch is undesirable in most applications.

Each of the output stage amplifiers (HFA, LFA) includes a current clamp circuit that sets the level of output current for the amplifier. The current clamp circuits are programmable. For example, each of the current clamp circuits may be connected to a writable register of a control circuit and the control circuit writes a specific value to the register to set the value of the current in the current clamp circuit. The control circuit may include processing circuitry (e.g., one or more of a processor, an application specific integrated circuit, or a field programmable gate array) to perform the functions described.

To reduce or remove any glitch at the output due to changing the output stage, a user can progressively increase or decrease the value of the output current for one or both amplifiers. For example, the user can progressively decrease the maximum output current provided by an output stage from a high level (e.g., 200 milliamps (200 mA)), to a low level (e.g., 0 mA). Conversely, the user can progressively increase the output current from a low level (e.g., 0 mA) to a high level (e.g., 200 mA).

The speed of the transition of the current level is controlled by the user, depending on how fast the user changes the value written in the register. By operating the clamp circuits of the HFA and LFA amplifiers at a speed slower than the bandwidth of the main loop of the test system circuit, the output glitch at the FORCE pin is greatly reduced.

In an illustrative example, assume that a DUT is connected to the circuit of FIG. 1 and that it is desired to transition the output current at the FORCE pin from the LFA to the HFA to change the range of current that can be provided to the DUT. Also assume the DUT is drawing 100 mA at the FORCE pin. Further assume that the clamp circuit of the HFA is set to 0 mA, effectively turning in the HFA OFF, and that the clamp circuit of the LFA is set to 200 mA, effectively causing the LFA to source the entire 100 mA to the DUT.

The HFA clamp circuit is turned ON by writing a register to transition the HFA clamp circuit gradually and slowly from 0 mA to 200 mA. If the LFA is times smaller than the HFA (e.g., the active circuit elements of the output stage of the LFA are 10 times smaller than the active elements of the HFA), by the end of the transition the HFA will absorb 90% of the current delivered to the DUT, and the remaining 10% is sourced by the LFA. The speed of the transition is made slower compared to the bandwidth of the main loop of the ATE system to keep any output glitch resulting from the transition small.

The LFA is then turned OFF by writing a register to gradually transition the LFA clamp current from 200 mA to 0 mA, again using a transition speed that is slower than the bandwidth of the main loop of the ATE system. In this way the glitch at the output and at the DUT is minimized. The reverse procedure can be used to transition the output current at the FORCE pin from the HFA to the LFA.

The force amplifiers can include a clamp circuit that forces or pegs the gate-to-source voltage ($V_{GS}$) of the output stage. This limits the current that the output stage can deliver to the DUT. A suitable $V_{GS}$ can be adjusted with an external control current, which makes the maximum current delivered to the DUT programmable over a wider dynamic range.

Figure 2:
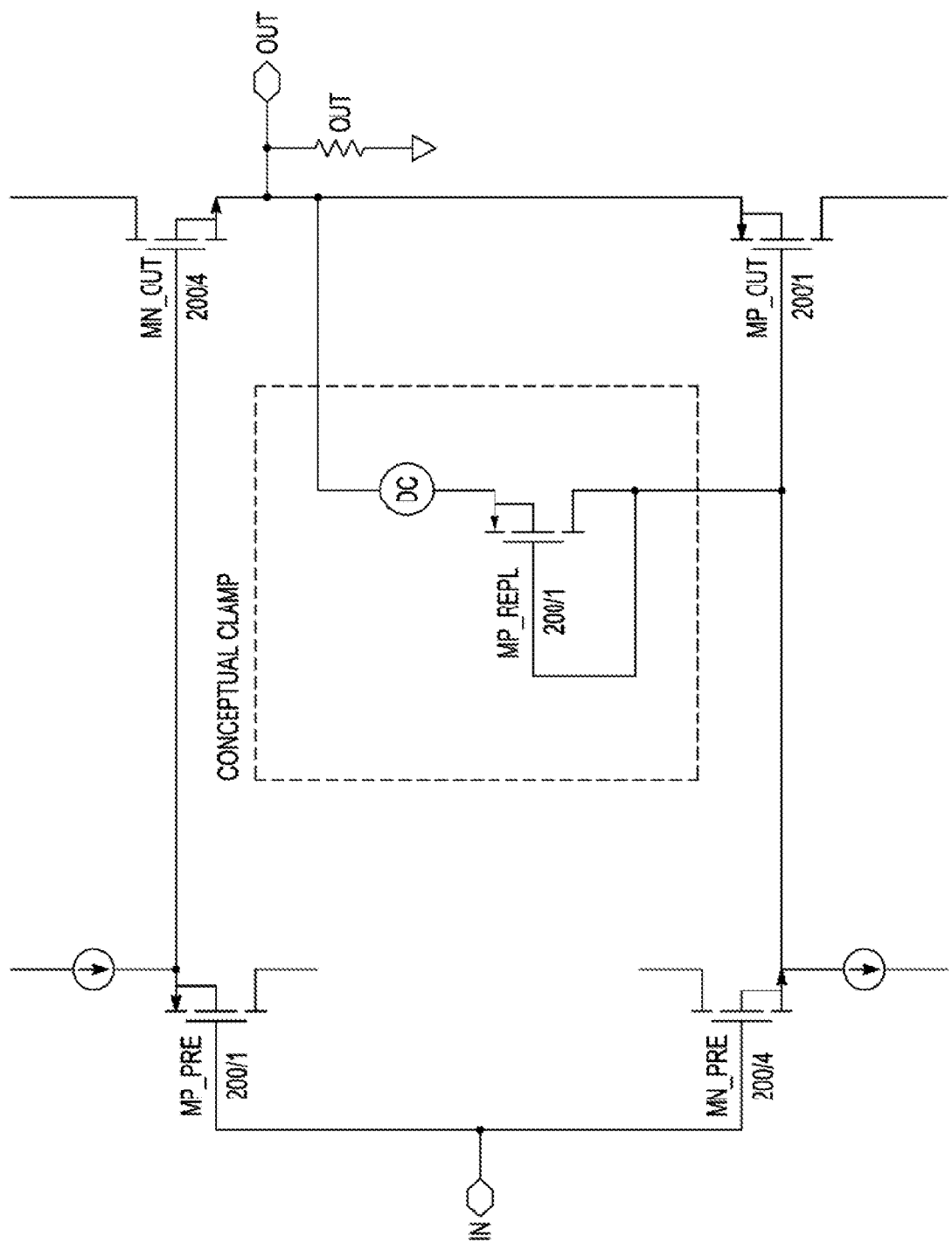
FIGS. 2-4 are examples of current clamp circuits useable in the testing circuit of FIG. 1.

FIG. 2 is a schematic of an example of an adjustable current clamp circuit useable in the force amplifiers to clamp the amplifier output current to a programmable value to protect the DUT and the test system. The DUT is represented by the output resistance OUT.

In the clamp circuit, transistors MP_PRE, MN_PRE, MP_OUT, and MN_OUT make up a complementary emitter-follower output buffer, which is biased by constant current sources $I_{TOP}$ and $I_{BOT}$. Device MP_REPL is a replica of output device MP_OUT. Replica device MP-REPL is a p-type field effect transistor (PFET) connected as a diode.

In the clamped condition and when sinking current at the output of the buffer, as shown in FIG. 2 current from current source $I_{BOT}$ flows in its entirety through device MP_REPL and voltage source ΔVgs.

Therefore, in the clamped condition device MP_REPL (plus voltage source ΔVgs) and output device MP_OUT behave as a flying current mirror, with device MN_REPL (plus voltage source ΔVgs) being the input maker diode of the mirror and transistor MP_OUT being the output device of the mirror. The output current $I_{OUT}$ is the sum of currents $I_{BOT}$ and $I_{MP\_OUT}$, with current $I_{MP\_OUT}$ being a scaled version of $I_{BOT}$ according to the area ratio of devices MP_OUT and MP_REPL and the value of voltage ΔVgs.

Figure 3:
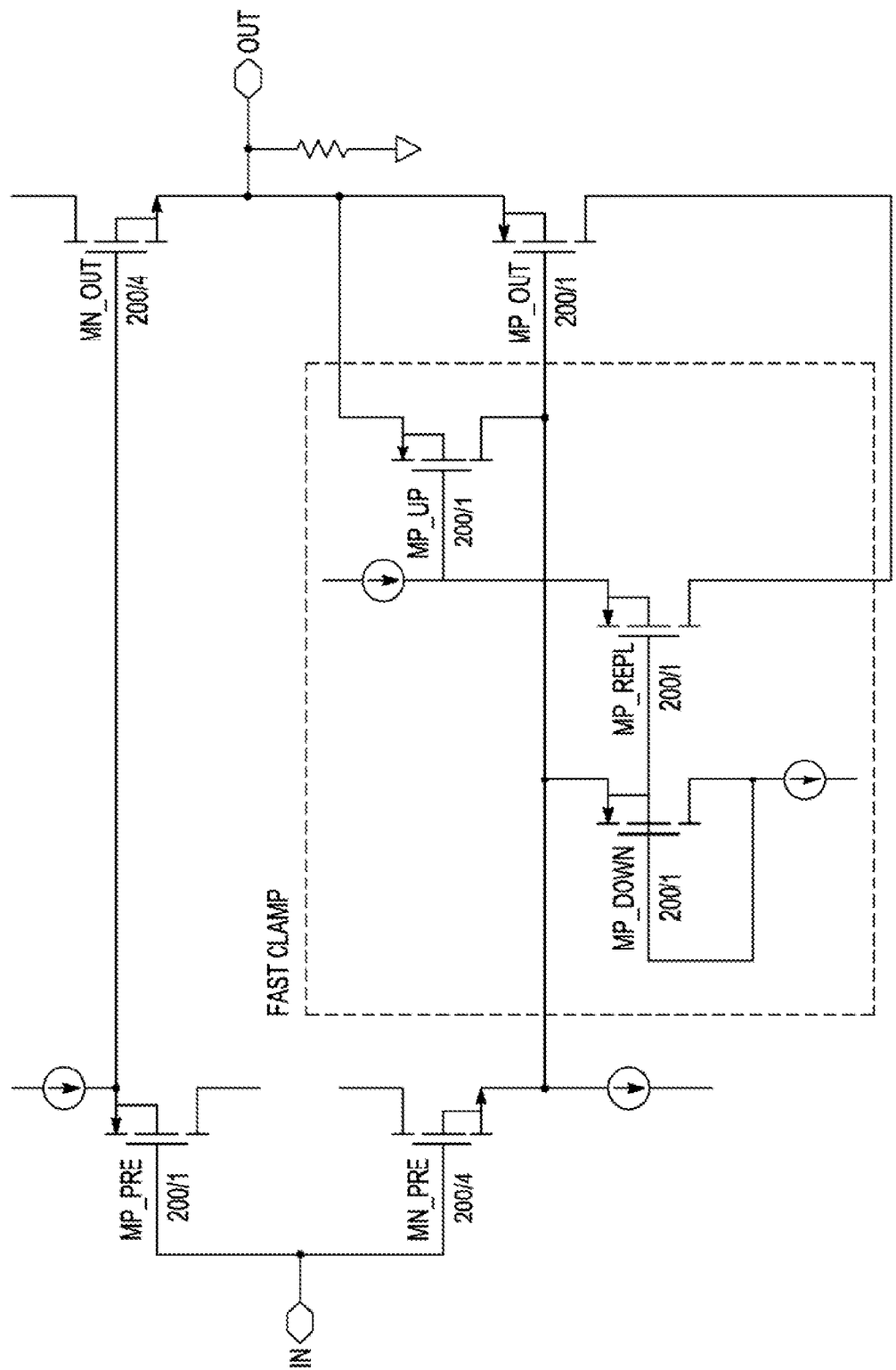

FIG. 3 is a schematic of an example of a current clamp circuit with the voltage ΔVgs set to zero. The current $I_{BOT}$ is split into two components: (I_9×) and (I_1×), or $I_{BOT}$=(I_9×)+(I_1×), where current (I_9×) is nine times the current of (I_1×).

As in the example of FIG. 2, when the clamp circuit is active and in the clamp condition, current $I_{BOT}$ flows in its entirety into the device that is doing the clamping (MP_UP in FIG. 3). At the same time, device MN_PRE is completely starved of current.

Because the currents in MP_UP and MP_DOWN are fixed and known (IBOT and I_1×, respectively) when the clamp is active, these devices can be sized to cancel their gate-to-source voltages ($V_{GS}$) against each other (in the example of FIG. 3, MP_UP is ten times (10×) larger than MP_DOWN). Therefore, the $V_{GS}$ of MP_REPL is exactly applied across the $V_{GS}$ of the output device MP_OUT when the clamp circuit is in the clamp condition.

Current I_ctrl controls the $V_{GS}$ of MP_REPL, so it controls the current in the output devices. The current $I_{CTRL}$ can be used to gradually transition the clamp current in the LFA and HFA amplifiers in the circuit of FIG. 1. A register can be used to set the value of $I_{CTRL}$, and the value of the register can be gradually changed to gradually transition the current clamp value of LFA or HFA. This makes the current clamp circuit programmable.

Because the current in MP_REPL mirrors the current (I_1×) in MP_DOWN, the current (I_1×) can also be varied (while keeping Ibot=I_9×+I_1× constant) to affect the clamp level. Increasing (I_1×) decreases the clamp level, while decreasing (I_1×) increases the clamp level. The current source can be implemented with multiple unit size current sources connected in parallel. A register can be used to set the value of current (I_1×) by enabling the unit size current sources, and the value of the register can be gradually changed to gradually transition the current clamp value of LFA or HFA.

It should be noted that while output device MP_OUT and MP_REPL should be of the same type (e.g., both rated to 205 volts, or 205V), devices MP_UP and MP_DOWN can be of a different type than MP_OUT and MP_REPL (e.g., rated to 5V, for example) and the clamp circuit still works.

There is a potential reliability issue with the clamp circuit of FIG. 3. The transistor MP_REPL. Because MP_REPL is a replica of output device MP_OUT, MP_REPL at the maximum current density at which the output device MP_OUT will run when the output device MP_OUT clamps to max output current.

Adding a suitable voltage ΔVgs in series with the $V_{GS}$ of MP_REPL (while keeping the current through MP_REPL unchanged) would solve the potential reliability issue. Device MP_REPL would run at a lower current density (i.e., cooler) while appearing to have a larger $V_{GS}$. The addition of ΔVgs would also extend the achievable current clamp range.

Figure 4:
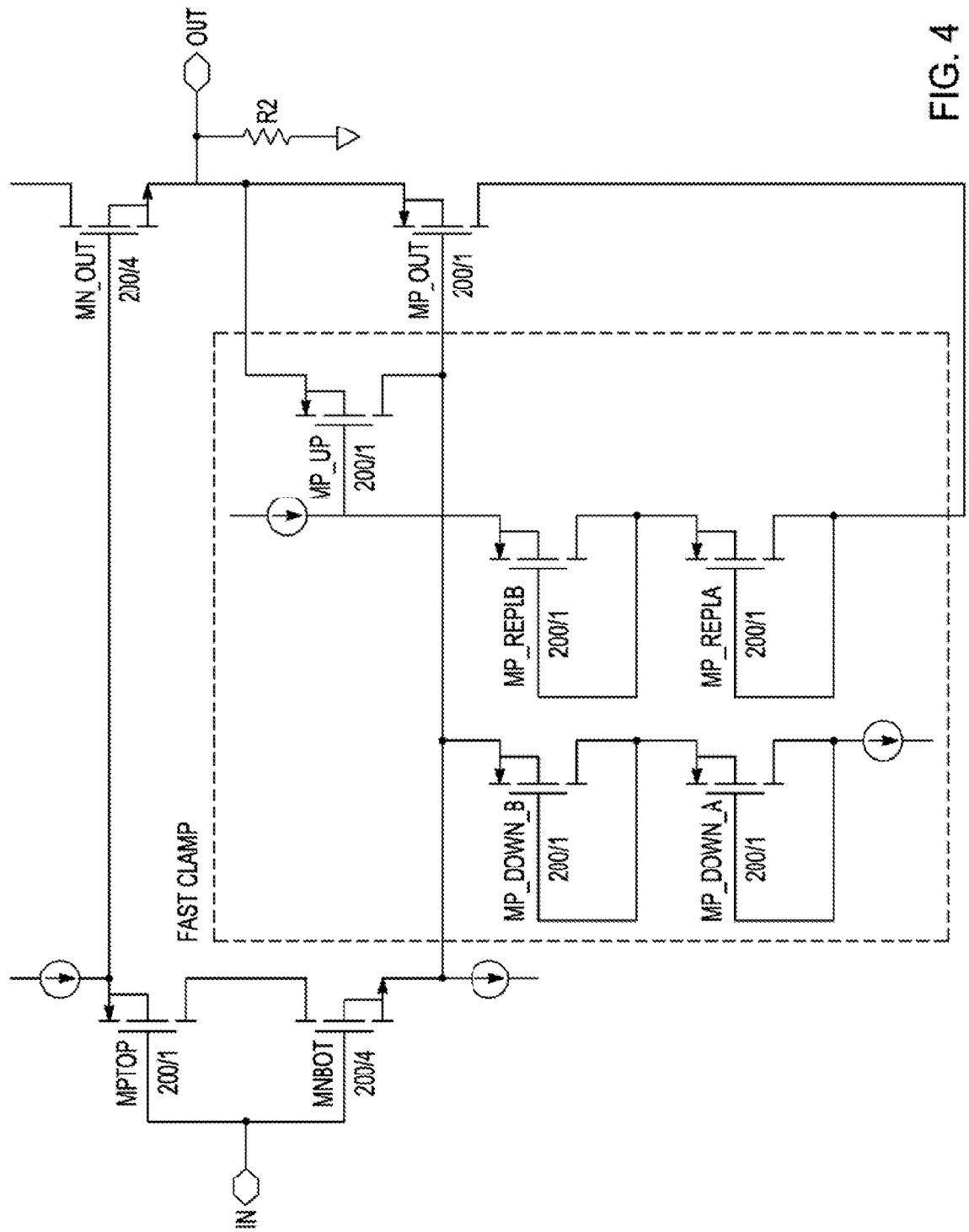

FIG. 4 is a schematic of an example of a current clamp circuit with a non-zero ΔVgs voltage. In FIG. 4, the ΔVgs voltage source of the example of FIG. 2 is implemented as the difference between the gate-to-source voltages ($V_{GS}$) of two devices running at different current densities.

The difference in FIG. 4 with respect to the example of FIG. 3 is the addition of devices MP_REPL_B and MP_DOWN_B. The difference in $V_{GS}$ between the device, or ΔVgs, appears in series with the $V_{GS}$ of MP_REPL. As in the example of FIG. 3, the $V_{GS}$ MP_UP and MP_DOWN cancel each other. Therefore, the $V_{GS}$ of output device MP_OUT is clamped to the $V_{GS}$ of MP_REPL plus ΔVgs.

The mirror ratio of the flying current mirror can be adjusted by varying the voltage ΔVgs. The voltage ΔVgs can be varied by varying current I_CTRL_INCR. If the voltage ΔVgs is programmable, the clamp circuits of FIGS. 2 and 4 are programmable and can be used to gradually transition the clamp current in the LFA and HFA amplifiers of FIG. 1. The clamp circuit is turned ON by writing a register to transition the clamp circuit through a current range.

The clamp level should be independent on process and the change in clamp current level should be linear with a change in the control current. It can be shown that the current $I_{MP\_OUT}$ of the output device MP_OUT is:

$$Imp\_out = (2*\sqrt{k}-1)*(I_{-1\times})*M$$

where k=$(I_{CTRL\_INCR})/(I\_1\times)$, $(I_{CTRL\_INCR})$ is the value of the $(I_{CTRL\_INCR})$ in FIG. 4, and M is the size of output device MP_OUT. The equation above shows that the clamp output current $I_{MP\_OUT}$ does not depend on process and that dependency on k is nearly linear. Therefore, the clamp level change due to a change in control current $I_{CTRL}$ is nearly linear.

Simulation of the change in clamp level current $I_{MP\_OUT}$ with respect to the change control current $I_{CTRL\_INCR}$ showed that the clamped output current varies from 0.2 A to 3 A, when control current $I_{CTRL\_INCR}$ varies from ten micro-amps (10 μA) to 200 μA with the output voltage varied from −10V to +70V.

Because the output current is never sampled, the current clamp circuits described herein are likely to remain stable for a variety of DUTs. The current clamp pegs the VGS of the output device to a value a priori known to produce the desired max output current without ever measuring it.

Returning to FIG. 1, an alternative to setting the current in the amplifiers to transition current at the FORCE pin between force amplifiers is to use a variable resistance. According to some aspects, the test circuitry includes a variable resistor $R_{HL}$ between the outputs of the HFA and LFA. This also places the variable shunt resistor $R_{HL}$ between resistors $R_{SH}$ and $R_{SL}$. Gradually changing the resistance value of $R_{HL}$ transitions the output current at the FORCE pin from the LFA to the HFA and vice versa.

In an illustrative example, assume that it is again desired to transition the output current at the FORCE pin from the LFA to the HFA. Switch SL is closed, switch SH is open, $R_{HL}$ is open (or set to a very large resistance) and current is being sourced from the FORCE pin to the LFA. Also assume that the LFA is again much smaller (e.g., 10× smaller). Switch SH is then closed and $R_{HL}$ is gradually closed or reduced. Gradually closing (or reducing) $R_{HL}$ gradually moves the current from the lower LFA circuit branch to the upper HFA circuit branch. $R_{HL}$ may be closed in steps (e.g., to change the voltage drop by 0.5 Volts. Switch SL is then opened. The reverse procedure can be used to move the current from the HFA to the LFA.

The devices, systems and methods described herein avoid test system errors due to switching at the output stage. The technique uses current clamp circuits inside the output stages. Because current clamp circuits may be included to limit the output current delivered to the DUT, the technique does not require extra circuitry to reduce output glitches. The technique can be used in more applications than in the automated test systems described herein. The technique can be used in any application where it is desired to limit the current at the load of an electronic circuit or electronic system.

ADDITIONAL DESCRIPTION AND ASPECTS

A first Aspect (Aspect 1) can include subject matter (such as a clamp circuit) comprising an output to provide an output current at a clamped current level; an output transistor and a replica transistor coupled as a current mirror pair, wherein the replica transistor is scaled in size to the output transistor by a size ratio; a first current source configured to set a current in the replica transistor, wherein the output current is set at a clamped output current value that is a sum of current of the first current source and a scaled value of the current of the first current source determined according to the size ratio; and a register circuit, wherein a register value stored in the register circuit sets the clamped output current value.

In Aspect 2, the subject of Aspect 1 optionally includes a second current source, the replica transistor is a field effect transistor (FET) and the second current source is coupled to a source or drain region of the replica transistor, and changing the register value changes current of the second current source to change a gate-to-source voltage of the replica transistor to set the clamped output current value.

In Aspect 3, the subject matter of one or both of Aspects 1 and 2 optionally includes a voltage source circuit coupled to the replica transistor and changing the register value changes voltage of the voltage source circuit to change the clamped output current value.

In Aspect 4, the subject matter of Aspect 3 optionally includes a replica transistor that is a field effect transistor (FET), and the voltage source circuit is coupled to a source or drain region of the FET.

In Aspect 5, the subject matter of one or both of Aspects 3 and 4 optionally includes a voltage source circuit that includes a first diode connected transistor and a second diode connected transistor, wherein a current density of the first diode connected transistor is different from a current density of the second diode connected transistor, and the voltage of the voltage source is a difference in gate-to-source voltage between the first diode connected transistor and the second diode connected transistor.

In Aspect 6, the subject matter of Aspect 5 optionally includes a replica transistor is a field effect transistor (FET), the first diode connected transistor is connected to the output transistor, and the second diode connected transistor is connected in series to a source or drain region of the replica transistor.

In Aspect 7, the subject matter of one or any combination of Aspects 1-6 optionally includes a third transistor coupled to the first current source, a replica transistor that is coupled to the third transistor to mirror current of the third transistor, and changing the register value changes current of the first current source to set the clamped output current value.

Aspect 8 can include subject matter (such as an automated test system) or can optionally be combined with one or any combination of Aspects 1-7 to include such subject matter, comprising a switch circuit coupled to an input/output (I/O) connection of the system, a force amplifier (FA) coupled to the switch circuit, a first adjustable current clamp circuit coupled to an output transistor of the FA; and a control circuit. The adjustable current clamp circuit includes a replica transistor coupled as a current mirror pair to the output transistor of the FA, wherein the replica transistor is scaled in size to the output transistor by a size ratio; a first current source configured to set a current in the replica transistor, wherein an output current of the FA is set to a clamped output current value that is a sum of current of the first current source and a scaled value of the current of the first current source determined according to the size ratio; and a register circuit, wherein a register value stored in the register circuit sets the clamped output current value. The control circuit is configured to activate the switch circuit and change a clamp current level of output current of the FA by changing the register value.

In Aspect 9, the subject matter of Aspect 8 optionally includes a first adjustable current source that includes a second current source; a replica transistor is a field effect transistor (FET) and the second current source is coupled to a source or drain region of the replica transistor; and a control circuit is configured to change the register value to change current of the second current source and a gate-to-source voltage of the replica transistor to change the clamp current level of output current of the FA.

In Aspect 10, the subject matter of Aspect 8 optionally includes a first adjustable current source that includes: a voltage source circuit coupled to the replica transistor, and the control circuit is configured to change the register value to change voltage of the voltage source circuit to change the clamp current level of output current of the FA.

In Aspect 11, the subject matter of Aspect 10 optionally includes a voltage source circuit of the first adjustable current source includes a first diode connected transistor and a second diode connected transistor, wherein a current density of the first diode connected transistor is different from a current density of the second diode connected transistor, and the voltage of the voltage source circuit is a difference in gate-to-source voltage between the first diode connected transistor and the second diode connected transistor.

In Aspect 12, the subject matter of Aspect 11 optionally includes a replica transistor of the first adjustable current source that is a field effect transistor (FET), the first diode connected transistor is connected to the output transistor of the FA, and the second diode connected transistor is connected in series to a source or drain region of the replica transistor.

In Aspect 13, the subject matter of one or any combination of Aspects 8-12 optionally includes a third transistor coupled to the first current source, a replica transistor is coupled to the third transistor to mirror current of the third transistor; and a control circuit configured to change the register value to change current of the first current source to set the clamp current level of output current of the FA.

In Aspect 14, the subject matter of one or any combination of Aspects 8-13 optionally includes a low side switch circuit coupled to the V/O connection; a low side force amplifier (LFA) coupled to the low side switch; a second adjustable current clamp circuit coupled to an output transistor of the FA; and a control circuit configured to change the current of one or both of the first adjustable clamp circuit and the second adjustable clamp circuit to change the control of current at the I/O connection from one of the FA or LFA to the other of the FA or LFA.

In Aspect 15, the subject matter of one or any combination of Aspects 8-14 optionally includes a first adjustable clamp circuit that clamps the output current of the FA to a higher range of clamp current levels than the second adjustable clamp circuit clamps the output current of the LFA.

Aspect 16 can include subject matter (such as an amplifier) or can optionally be combined with one or any combination of Aspects 1-15 to include such subject matter, comprising an output circuit stage having an output transistor, and an adjustable current clamp circuit coupled to the output transistor. The adjustable current clamp circuit includes a replica transistor coupled as a current mirror pair to the output transistor of the FA, wherein the replica transistor is scaled in size to the output transistor by a size ratio; a first current source configured to set a current in the replica transistor, wherein an output current of the amplifier is set to a clamped output current value that is a sum of current of the first current source and a scaled value of the current of the first current source determined according to the size ratio; and a register circuit, wherein a register value stored in the register circuit sets the clamped output current value.

In Aspect 17, the subject matter of Aspect 16 optionally includes an adjustable current clamp circuit that includes a second current source, a replica transistor that is a field effect transistor (FET) and the second current source is coupled to a source or drain region of the replica transistor; and a register value stored in the register circuit sets current of the second current source to set a gate-to-source voltage of the replica transistor to set the clamped output current value.

In Aspect 18, the subject matter of Aspect 16 optionally includes a voltage source circuit; a replica transistor is a field effect transistor (FET), the voltage source circuit is coupled to a source or drain region of the replica transistor, and the register value stored in the register circuit sets voltage of voltage source circuit to set the clamped output current value.

In Aspect 19, the subject matter of Aspect 18 optionally includes a voltage source circuit that includes a first diode connected transistor and a second diode connected transistor, wherein a current density of the first diode connected transistor is different from a current density of the second diode connected transistor, and the voltage of the voltage source is a difference in gate-to-source voltage between the first diode connected transistor and the second diode connected transistor.

In Aspect 20, the subject matter of Aspect 19 optionally includes the first diode connected transistor is connected to the output transistor, and the second diode connected transistor is connected in series to a source or drain region of the replica transistor.

These nonlimiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the described aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment.

What is claimed is:

1. A clamp circuit comprising:
an output to provide an output current at a clamped current level;
an output transistor and a replica transistor coupled as a current mirror pair, wherein the replica transistor is scaled in size to the output transistor by a size ratio;
a first current source configured to set a current in the replica transistor, wherein the output current is set at a clamped output current value that is a sum of current of the first current source and a scaled value of the current of the first current source determined according to the size ratio; and
a register circuit, wherein a register value stored in the register circuit sets the clamped output current value;
a voltage source circuit coupled to the replica transistor, and changing the register value changes voltage of the voltage source circuit to change the clamped output current value and, wherein the voltage source circuit includes a first diode connected transistor and a second diode connected transistor, wherein a current density of the first diode connected transistor is different from a current density of the second diode connected transistor, and the voltage of the voltage source is a difference in gate-to-source voltage between the first diode connected transistor and the second diode connected transistor.

2. The clamp circuit of claim 1, including:
a second current source;
wherein the replica transistor is a field effect transistor (FET) and the second current source is coupled to a source or drain region of the replica transistor; and
wherein changing the register value changes current of the second current source to change a gate-to-source voltage of the replica transistor to set the clamped output current value.

3. The clamp circuit of claim 1, wherein the replica transistor is a field effect transistor (FET), and the voltage source circuit is coupled to a source or drain region of the FET.

4. The clamp circuit of claim 1, wherein the replica transistor is a field effect transistor (FET), the first diode connected transistor is connected to the output transistor, and the second diode connected transistor is connected in series to a source or drain region of the replica transistor.

5. The clamp circuit of claim 1,
a third transistor coupled to the first current source;
wherein the replica transistor is coupled to the third transistor to mirror current of the third transistor; and
wherein changing the register value changes current of the first current source to set the clamped output current value.

6. An automated testing system, the system comprising:
a switch circuit coupled to an input/output (I/O) connection of the system;
a force amplifier (FA) coupled to the switch circuit;
a first adjustable current clamp circuit coupled to an output transistor of the FA, the first adjustable current clamp circuit including:
a replica transistor coupled as a current mirror pair to the output transistor of the FA, wherein the replica transistor is a field effect transistor (FET) and is scaled in size to the output transistor by a size ratio;
a first current source configured to set a current in the replica transistor, wherein an output current of the FA is set to a clamped output current value that is a sum of current of the first current source and a scaled value of the current of the first current source determined according to the size ratio;
a second current source coupled to a source or drain region of the replica transistor, and
a register circuit, wherein a register value stored in the register circuit sets the clamped output current value; and
a control circuit configured to activate the switch circuit and change the register value to change current of the second current source and a gate-to-source voltage of the replica transistor to change the clamped output current value of output current of the FA.

7. The system of claim 6, wherein the first adjustable current source includes:
a voltage source circuit coupled to the replica transistor, and the control circuit is configured to change the register value to change voltage of the voltage source circuit to change the clamped output current value of output current of the FA.

8. The system of claim 7, wherein the voltage source circuit of the first adjustable current source includes a first diode connected transistor and a second diode connected transistor, wherein a current density of the first diode connected transistor is different from a current density of the second diode connected transistor, and the voltage of the voltage source circuit is a difference in gate-to-source voltage between the first diode connected transistor and the second diode connected transistor.

9. The system of claim 8, wherein the first diode connected transistor is connected to the output transistor of the FA, and the second diode connected transistor is connected in series to a source or drain region of the replica transistor.

10. The system of claim 6, wherein the first adjustable current clamp circuit includes:
a third transistor coupled to the first current source;
wherein the replica transistor is coupled to the third transistor to mirror current of the third transistor; and
wherein the control circuit is configured to change the register value to change current of the first current source to set the clamped output current value of output current of the FA.

11. The system of claim 6, including:
a low side switch circuit coupled to the I/O connection;
a low side force amplifier (LFA) coupled to the low side switch;
a second adjustable current clamp circuit coupled to an output transistor of the FA; and
wherein the control circuit is configured to change the current of one or both of the first adjustable clamp circuit and the second adjustable clamp circuit to change the control of current at the I/O connection from one of the FA or LFA to the other of the FA or LEA.

12. The system of claim 11, wherein the first adjustable clamp circuit clamps the output current of the FA to a higher range of clamp current levels than the second adjustable clamp circuit clamps the output current of the LFA.

13. An amplifier comprising:
an output circuit stage having an output transistor; and
an adjustable current clamp circuit coupled to the output transistor, wherein the adjustable current clamp circuit includes:
a replica transistor coupled as a current mirror pair to the output transistor of the output circuit stage, wherein the replica transistor is a field effect transistor (FET) and is scaled in size to the output transistor by a size ratio;
a first current source configured to set a current in the replica transistor, wherein an output current of the amplifier is set to a clamped output current value that is a sum of current of the first current source and a scaled value of the current of the first current source determined according to the size ratio;
a second current source coupled to a source or drain region of the replica transistor, and
a register circuit, wherein a register value stored in the register circuit sets current of the second current source to set a gate-to-source voltage of the replica transistor to set the clamped output current value.

14. The amplifier of claim 13, wherein the adjustable current clamp circuit includes:
a voltage source circuit;
wherein the voltage source circuit is coupled to a source or drain region of the replica transistor, and the register value stored in the register circuit sets voltage of voltage source circuit to set the clamped output current value.

15. The amplifier of claim 14, wherein the voltage source circuit includes a first diode connected transistor and a second diode connected transistor, wherein a current density of the first diode connected transistor is different from a current density of the second diode connected transistor, and the voltage of the voltage source is a difference in gate-to-source voltage between the first diode connected transistor and the second diode connected transistor.

16. The amplifier of claim 15, wherein the first diode connected transistor is connected to the output transistor, and the second diode connected transistor is connected in series to a source or drain region of the replica transistor.

* * * * *